(12) United States Patent
Guo et al.

(10) Patent No.: US 11,047,913 B2
(45) Date of Patent: Jun. 29, 2021

(54) METHOD OF MEASURING AN AMOUNT OF MOTOR BONDING

(71) Applicant: DONGFENG DANA AXLE CO., LTD., Hubei (CN)

(72) Inventors: Ning Guo, Xiangyang (CN); Shengli Hu, Xiangyang (CN); Kaishuo Zhang, Xiangyang (CN); Minghan Tang, Xiangyang (CN)

(73) Assignee: DONGFENG DANA AXLE CO., LTD., Xiangyang (CN)

( * ) Notice: Subject to any disclaimer, the term of this patent is extended or adjusted under 35 U.S.C. 154(b) by 0 days.

(21) Appl. No.: 16/643,506

(22) PCT Filed: Aug. 31, 2018

(86) PCT No.: PCT/CN2018/103423
§ 371 (c)(1),
(2) Date: Feb. 28, 2020

(87) PCT Pub. No.: WO2019/042388
PCT Pub. Date: Mar. 7, 2019

(65) Prior Publication Data
US 2020/0191870 A1 Jun. 18, 2020

(30) Foreign Application Priority Data

Aug. 31, 2017 (CN) .......................... 201710774407.3

(51) Int. Cl.
*B60L 53/124* (2019.01)
*G01R 31/34* (2020.01)
(52) U.S. Cl.
CPC .................. *G01R 31/343* (2013.01)
(58) Field of Classification Search
CPC ..... G08G 1/042; B60L 53/124; B60L 53/126; B60L 53/30; B60L 53/36; B60L 53/38;
(Continued)

(56) References Cited

U.S. PATENT DOCUMENTS

2003/0001544 A1   1/2003 Nakanishi

FOREIGN PATENT DOCUMENTS

CN   201387461 Y   1/2010
CN   103633276 A   3/2014
(Continued)

OTHER PUBLICATIONS

ISA State Intellectual Property Office of the People's Republic of China, International Search Report and Written Opinion Issued in Application No. PCT/CN2018/103423, dated Oct. 31, 2018, WIPO, 7 pages.

*Primary Examiner* — Alesa Allgood
(74) *Attorney, Agent, or Firm* — McCoy Russell LLP

(57) ABSTRACT

A method of determining an amount of metallic particles within a motor. The method includes providing an electrical circuit with one or more electro-chemical cells, a motor, a motor output shaft resistor, a motor resistor, a motor housing resistor, a suspension resistor in electrical communication with an iron line, a motor mount resistor in electrical communication with an intermediate line and an iron wire resistor. The intermediate line electrically connects a motor cover portion and a frame iron point of the circuit. Once provided, a resistance and voltage between the motor cover portion of the motor and the frame iron point of the circuit may be measured. After the resistance and voltage has been measured, an iron line current and as assembly current may be determined. Once calculated, it may be determined whether or not an amount of particles within the motor has exceeded a pre-determined amount.

20 Claims, 3 Drawing Sheets

(58) Field of Classification Search
CPC ....... B60L 53/66; E05F 15/46; H02K 19/103; G01R 31/00; G01R 31/50; G01R 19/00; G01R 27/00
See application file for complete search history.

(56) References Cited

FOREIGN PATENT DOCUMENTS

| | | | | |
|---|---|---|---|---|
| CN | 104237702 | * | 12/2014 | ............ G01R 31/00 |
| CN | 104237702 | A | 12/2014 | |
| CN | 204347479 | U | 5/2015 | |
| WO | 2016133168 | A1 | 8/2016 | |

* cited by examiner

METHOD OF MEASURING AN AMOUNT OF MOTOR BONDING

CROSS-REFERENCE TO RELATED APPLICATION

The present application is a U.S. National Phase Application of International Patent Application Serial No. PCT/CN2018/103423 entitled "A METHOD OF MEASURING AN AMOUNT OF MOTOR BONDING," filed on Aug. 31, 2018. International Patent Application Serial No. PCT/CN2018/103423 claims priority to Chinese Invention Application No. CN201710774407.3 filed on Aug. 31, 2017. The entire contents of each of the above-listed applications are hereby incorporated by reference for all purposes.

TECHNICAL FIELD

The present disclosure relates to a method of measuring an amount of motor bonding. Additionally, the present disclosure relates to a method of measuring an amount of metallic particles within a motor.

BACKGROUND

In recent years, the development of electric and hybrid electric vehicles has increased. As a result, the overall amount of electrical components and systems within vehicles is increasing. The problem with conventional electrical components and systems, such as electric motors, is the collection and/or generation of an amount of iron particles or iron filings within the electric motor. The iron particles or iron filings are typically created and/or accumulated within the electric motor as a result of normal operation of the electric motor over time. As the overall amount of iron particles or iron filings increase within the electric motor, the overall efficiency of the electric motor and the ability to operate the motor safely decreases.

It would therefore be advantageous to develop a method of measuring an amount of metallic particles within a motor. Additionally, it would be advantageous to determine whether or not the motor may pose a potential safety hazard before a failure occurs.

SUMMARY

A method of determining an amount of metallic particles within a motor. The method includes providing an electrical circuit with one or more electro-chemical cells, a motor, a motor output shaft resistor R1, a motor resistor R2, a motor housing resistor R3, a suspension resistor R4 in electrical communication with an iron line, a motor mount resistor R5 in electrical communication with an intermediate line and an iron wire resistor R6. The intermediate line provides an electrical connection between a motor cover portion and a frame iron point of the electrical circuit. Once the circuit has been provided a resistance and voltage between the motor cover portion of the motor and the frame iron point of the circuit may be measured. After the resistance and voltage has been measured, an iron line current IA and as assembly current IB may be determined. Once the currents IA and IB have been calculated, it may be determined whether or not an amount of metallic particles within the motor has exceeded a pre-determined amount.

BRIEF DESCRIPTION OF THE DRAWINGS

The above, as well as other advantages of the present disclosure, will become readily apparent to those skilled in the art from the following detailed description when considered in light of the accompanying drawings in which.

DETAILED DESCRIPTION OF THE DRAWINGS

It is to be understood that the invention may assume various alternative orientations and step sequences, except where expressly specified to the contrary. It is also understood that the specific devices and processes illustrated in the attached drawings, and described in the specification are simply exemplary embodiments of the inventive concepts disclosed and defined herein. Hence, specific dimensions, directions or other physical characteristics relating to the various embodiments disclosed are not to be considered as limiting, unless expressly stated otherwise.

It is within the scope of this disclosure, and as a non-limiting example, that the method of measuring an amount of iron within a motor disclosed herein may be used in automotive, off-road vehicle, all-terrain vehicle, construction, structural, marine, aerospace, locomotive, military, machinery, robotic and/or consumer product applications. Additionally, as a non-limiting example, the method of measuring an amount of iron within a motor disclosed herein may also be used in passenger vehicle, electric vehicle, hybrid vehicle, commercial vehicle, autonomous vehicles, semi-autonomous vehicles and/or heavy vehicle applications.

Figure 1:
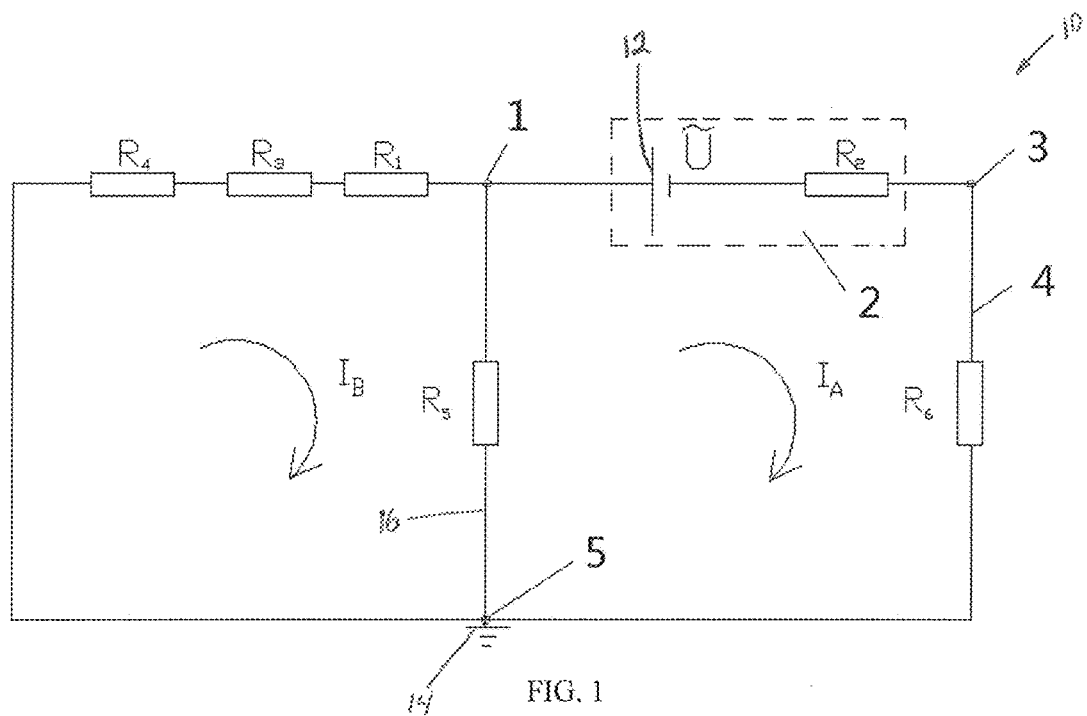
FIG. 1 is a schematic illustration of an electrical circuit for use in a motor vehicle.

FIG. 1 is a schematic illustration of an electrical circuit 10 for use in a motor vehicle (not shown). As illustrated in FIG. 1 of the disclosure and as a non-limiting example, the electrical circuit 10 may include a motor 2 that is in electrical communication with one or more electro-chemical cells 12. The electrical circuit 10 illustrated in FIG. 1 may represent the electrical circuit of the entire vehicle chassis (not shown). It is within the scope of this disclosure and as a non-limiting example that the one or more electro-chemical cells 12 may be one or more batteries, one or more rechargeable batteries, one or more fuel cells and/or any other type of device that is capable of storing and/or supplying an amount of electrical power to the motor 2 of the vehicle (not shown). Additionally, it is within the scope of this disclosure and as a non-limiting example that the motor 2 may be an electric motor or any other motor that is capable of converting an amount of electrical power into rotational power.

In accordance with the embodiment illustrated in FIG. 1 of the disclosure and as a non-limiting example, the electrical circuit 10 may include a motor output shaft resistor R1, a motor housing resistor R3 and/or a suspension resistor R4. As illustrated in FIG. 1 and as a non-limiting example, the motor housing resistor R3 may be interposed between the suspension resistor R4 and the motor output shaft resistor R1 in the electrical circuit 10. It is therefore to be understood that the motor output shaft resistor R1, the motor housing resistor R3 and/or the suspension resistor R4 of the electrical circuit 10 set forth three different measuring points for the chassis (not shown) of the vehicle (not shown). As a non-limiting example that the resistors R1, R3 and R4 may be wired in series in relation to one another.

The electrical circuit 10 may further include a motor resistor R2. At least a portion of the motor resistor R2 may be disposed within at least a portion of the motor 2. It is within the scope of this disclosure and as a non-limiting example that the motor resistor R2 may be wired in series in relation to the resistors R1, R3 and R4 of the electrical circuit 10 of the vehicle (not shown).

As illustrated in FIG. 1 and as a non-limiting example, the electrical circuit 10 may include a motor cover portion 1 and/or a motor iron point 3. The motor cover portion 1 of the motor 2 may be in electrical communication with the electrical circuit 10 at a location between the motor output shaft resistor R1 and the motor 2 of the vehicle (not shown). Additionally, the motor iron point 3 may be in electrical communication with the electrical circuit 10 such that the motor resistor R2 is interposed between the motor cover portion 1 and the motor iron point 3 of the electrical circuit 10.

At least a portion of an iron line 4 of the electrical circuit 10 may be in electrical communication with at least a portion of the motor iron point 3 and a frame iron point 5 of the electrical circuit 10. Disposed along at least a portion of the iron line 4 and in electrical communication with at least a portion of the iron line 4 of the electrical circuit 10 is an iron wire resistor R6. It is within the scope of this disclosure and as a non-limiting example, that the frame iron point 5 may also serve as a ground 14 for the electrical circuit 10 of the vehicle (not shown).

The electrical circuit 10 may further include a motor mount resistor R5 in electrical communication with at least a portion of an intermediate line 16. At least a portion of the motor mount resistor R5 may be in electrical communication with at least a portion of motor mount resistor R5 may be in electrical communication with and interposed between at least a portion of the motor cover portion 1 and/or the frame iron point 5 of the electrical circuit 10. It is within the scope of this disclosure and as a non-limiting example that the motor mount resistor R5 may be wired in parallel with the iron wire resistor R6. Additionally, it is within the scope of this disclosure and as a non-limiting example that the motor output shaft resistor R1, the motor housing resistor R3 and/or the suspension resistor R4 may be wired in series with the parallel configuration of the motor mount resistor R5 and the iron wire resistor R6 thereby providing the electrical circuit 10 of the vehicle (not shown) with a series-parallel configuration.

An iron line current IA may be determining by utilizing the resistance R6 of the iron line 4 of the electrical circuit 10 of the vehicle (not shown). Additionally, the assembly current IB may be determined by utilizing the iron line current IA determined and the amount of motor mount current.

Figure 2:
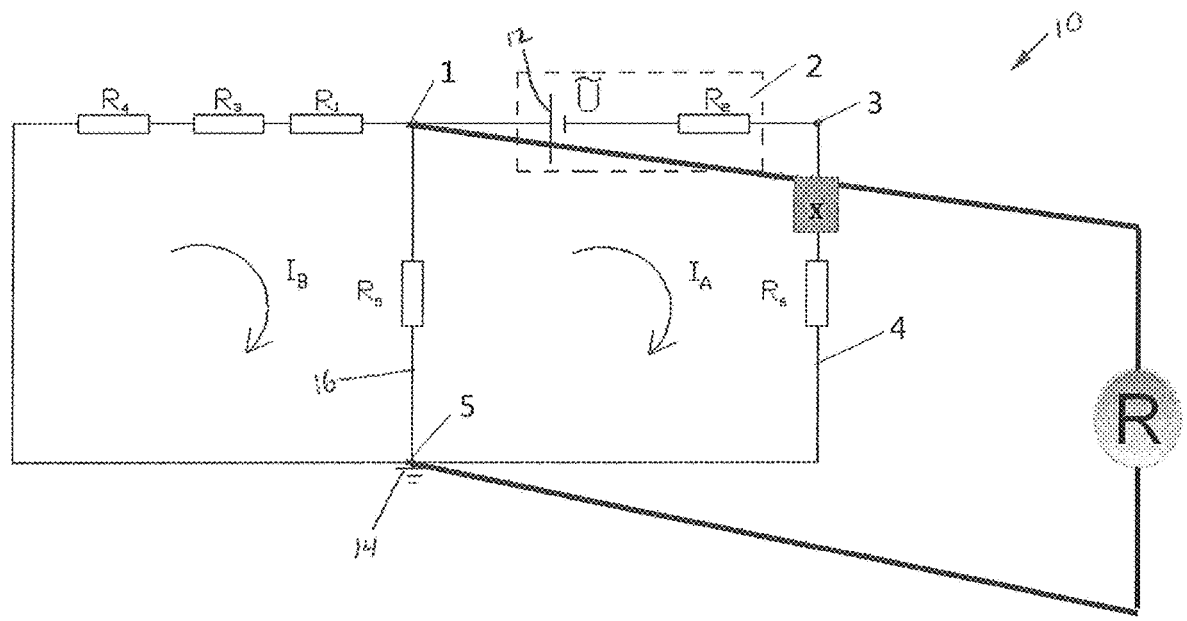
FIG. 2 is a schematic illustration of the electrical circuit of FIG. 1 measuring a resistance between a motor cover portion of a motor and a frame iron point of the vehicle.
Figure 4:
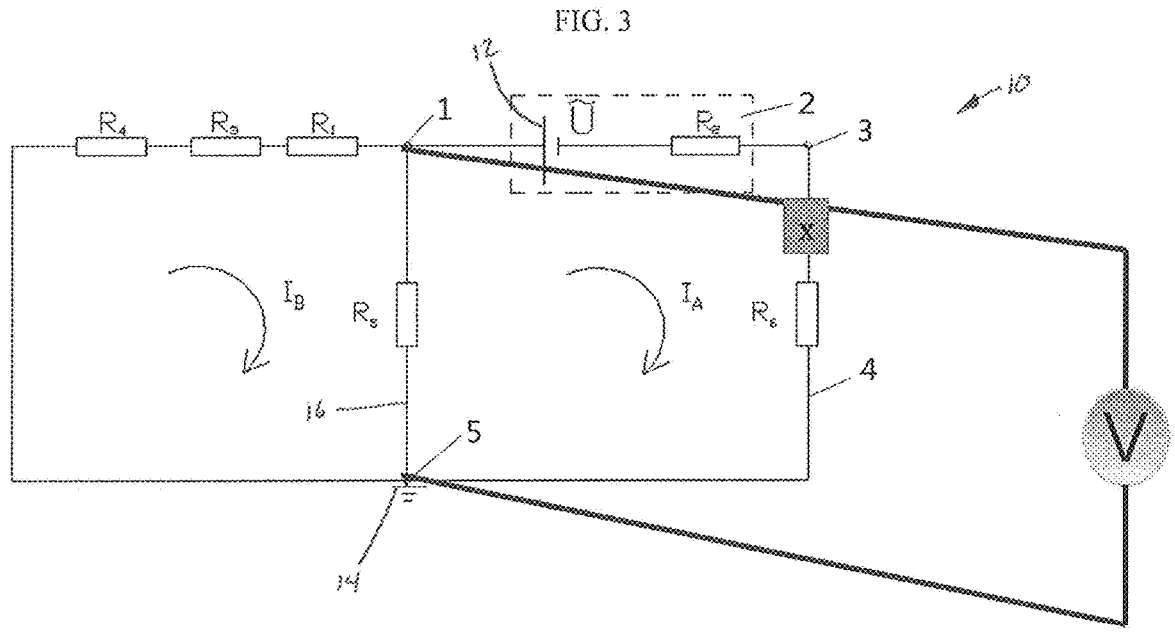
FIG. 4 is a schematic illustration of the electrical circuit of FIGS. 1-3 measuring a voltage between the motor cover portion of the motor and the frame iron point of the vehicle.

FIGS. 2 and 4 provide a schematic illustration of the electrical circuit 10 of FIG. 1 measuring a resistance between the motor cover portion 1 of the motor 2 and frame iron point 5 of the vehicle (not shown). The method of measuring an amount of metallic particles within the motor 2 of the vehicle (not shown) may be determined by first providing the electrical circuit 10 described and illustrated in relation to FIG. 1 of the disclosure. Once the electrical circuit 10 has been provided, the iron line 4 may be disconnected from the electrical circuit 10. After the iron line 4 has been disconnected from the electrical circuit 10, a voltage between the motor cover portion 1 of the motor 2 and the frame iron point 5 may be determined. A resistance value may then be determined between the motor cover portion 1 of the motor 2 and the frame iron point 5 and the output shaft of the motor 2 may be disconnected from the electrical circuit 10 of the vehicle (not shown). It is within the scope of this disclosure and as a non-limiting example that the metallic particles measured may be an amount of iron particles within the motor 2 of the vehicle (not shown).

Figure 3:
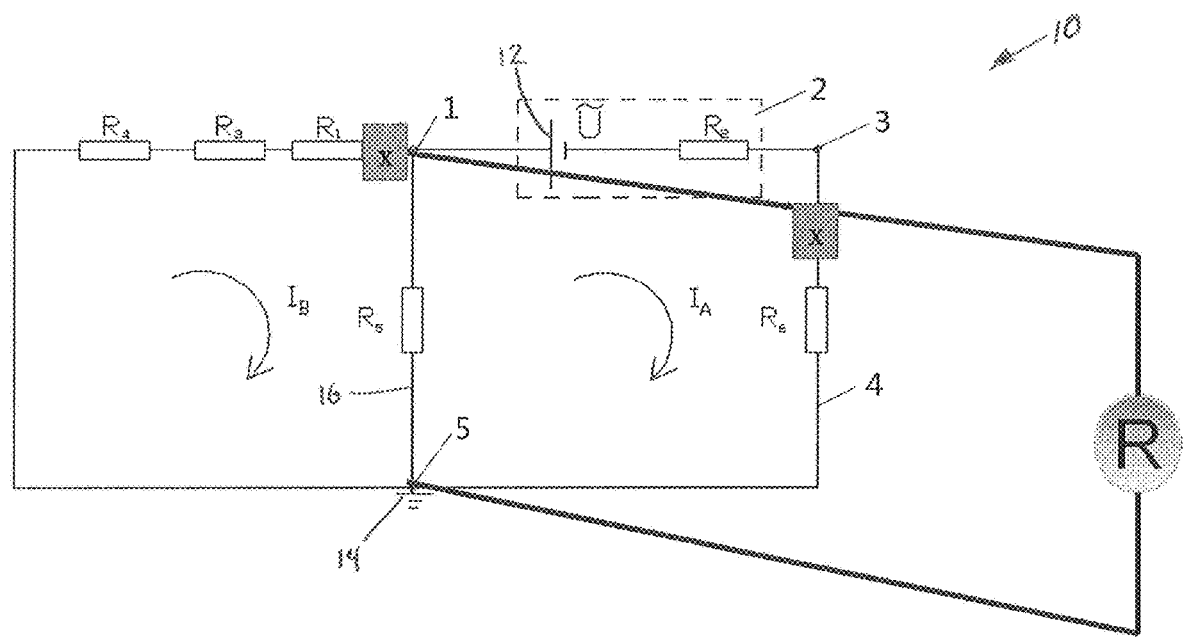
FIG. 3 is a schematic illustration of the electrical circuit of FIGS. 1 and 2 measuring and/or monitoring a resistance between the motor cover portion of the motor and the frame iron point of the vehicle.

FIG. 3 is a schematic illustration of the electrical circuit of FIGS. 1, 2 and 4 measuring and/or monitoring a resistance between the motor cover portion 1 of the motor 2 and the frame iron point 5 of the vehicle (not shown). After the electrical circuit 10 have been provided, the voltage between the motor cover portion 1 of the motor 2 and the frame iron point 5 has been determined and the resistance value between the motor cover portion 1 of the motor 2 and the frame iron point 5 has been determined, a voltage value between the motor cover portion 1 of the motor 2 and the frame iron point 5 may be determined. It is within the scope of this disclosure and as a non-limiting example that the voltage value between the motor cover portion 1 of the motor 2 and the frame iron point 5 may be determined or calculated by dividing the resistance value previously determined by 5 in order to obtain the assembly current IB.

The specific operation for determining the assembly current IB may be performed as set forth as follows. First, an amount of electricity may be applied to the motor 2 of the electrical current 10 of the vehicle (not shown). Once an amount of electrical energy has been supplied to the motor 2, the motor 2 may be disconnected from driving engagement with the rest of the driveline components (not shown) of the vehicle (not shown) and a resistance between the cover portion 1 of the motor 2 and the frame iron point 5 may be determined. After the resistance between the cover portion 1 of the motor 2 and the frame iron point 5 has be determined, the motor 2 may be drivingly connected to the driveline (not shown) of the vehicle (not shown). Once the motor 2 has been drivingly connected to the driveline (not shown), a series resistance of the motor output shaft resistor R1, the motor housing resistor R3 and/or the suspension resistor R4 may be determined Finally, the voltage valve between the cover portion 1 of the motor 2 and the frame iron point 5 may be measured based upon the amount of electrical power to the electrical circuit 10 at a pre-determined speed. As illustrated in FIG. 3 of the disclosure and as a non-limiting example, the assembly current IB may then be determined or calculated before the frame iron point 5 and the motor mount resistor R5 of the electrical circuit 10 of the vehicle (not shown).

Figure 5:
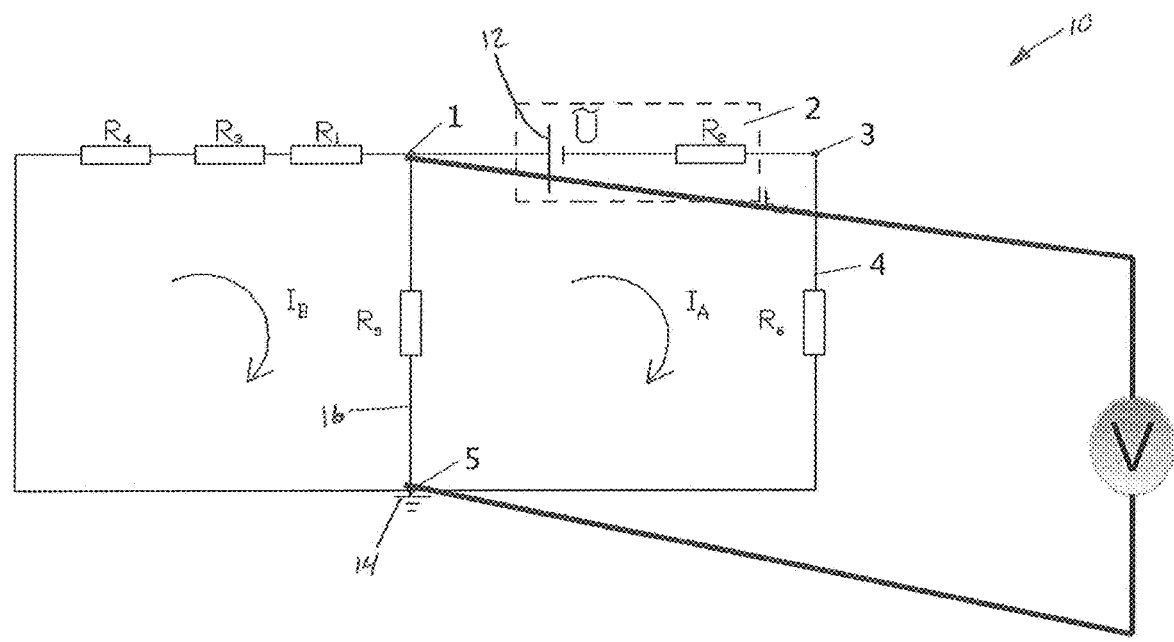
FIG. 5 is a schematic illustration of the electrical circuit of FIGS. 1-4 measuring a voltage between the motor cover portion of the motor and the frame iron point of the vehicle.
Figure 6:
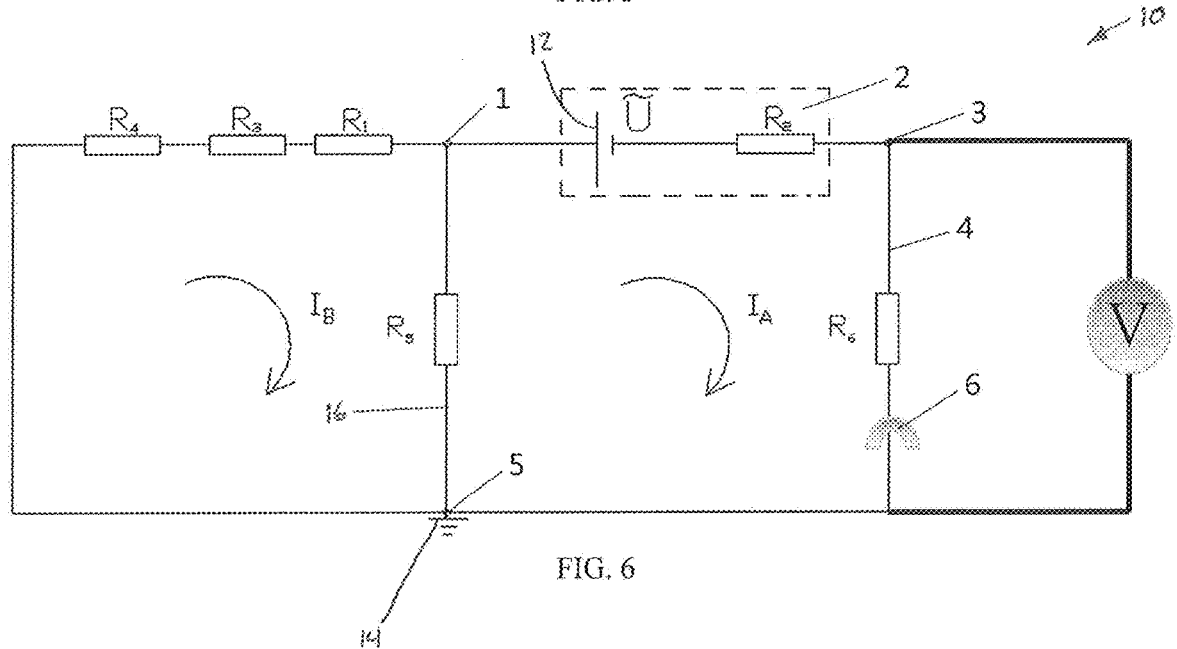
FIG. 6 is a schematic illustration of the electrical circuit of FIGS. 1-5 measuring a voltage between the motor cover portion of the motor and the frame iron point of the vehicle using a voltmeter and a current caliper.

FIGS. 5 and 6 provide a schematic illustration of the electrical circuit 10 of FIGS. 1-4 measuring a voltage between the motor cover portion 1 of the motor 2 and the frame iron point 5 of the vehicle (not shown). After the addition of the iron line 4 to the electrical circuit 10, the voltage value between the motor cover portion 1 of the motor 2 and the frame iron point 5 may be determined by using a current caliper 6 in order to measure or determine the iron line current IA of the electrical circuit 10 of the vehicle (not shown).

It is to be understood that the assembly current IB may be determined based on the iron line current IA of the electrical circuit 10 determined, measures or calculated. The specific operations is as follows: an amount of power is supplied to the motor 2 in accordance with a desired rotational speed and a voltage value is measures between the motor cover portion 1 of the motor 2 and the frame iron point 5. The motor mount resistor R5 may then be used in order to determine or calculate the amount of iron after the motor cover portion 1. A resistance may then be measured or determined using the iron wire resistor R6 while the motor 2 has an amount of electrical power supplied thereto. While using the current caliper 6, to measure the amount of current in the iron line 4 a resistance at the iron wire resistor R6 may be determined.

By measuring the iron line current IA and/or the assembly current IB before and after the addition of the iron line 4 to the electrical circuit 10, it allows a control unit (not shown) to determine whether the motor 2 is operating normally or abnormally due to an accumulation of metallic particles within the motor 2. Once the iron line current IA and/or the assembly current IB have exceeded a pre-determined limit, a warning may be issued to replace and/or repair the motor 2 or the motor 2 may be shut down in order to avoid a potential failure. This also allows the control unit (not shown) of the vehicle (not shown) to determine the iron line current IA and/or the assembly current IB for the vehicle (not shown) for both a rear axle system (not show) and a forward axle system (not shown) independently. If the iron line current IA and/or the assembly current IB for the motor 2 of the forward axle system (not shown) is larger than the iron line current IA and/or the assembly current IB for the motor 2 of the rear axle system (not shown), then an amount of metallic particles has likely accumulated within the motor 2 of the forward axle system (not shown). This may trigger a warning to be issued to replace and/or repair the motor 2 of the forward axle system (not shown) or the motor 2 of the forward axle system (not shown) may be shut down in order to avoid a potential failure. Additionally, if the iron line current IA and/or the assembly current IB for the motor 2 of the rear axle system (not shown) is larger than the iron line current IA and/or the assembly current IB for the motor 2 of the forward axle system (not shown), then an amount of metallic particles has likely accumulated within the motor 2 of the rear axle system (not shown). This may trigger a warning to be issued to replace and/or repair the motor 2 of the rear axle system (not shown) or the motor 2 of the rear axle system (not shown) may be shut down in order to avoid a potential failure.

It is to be understood that the various embodiments described in this specification and as illustrated in the attached drawings are simply exemplary embodiments illustrating the inventive concepts as defined in the claims. As a result, it is to be understood that the various embodiments described and illustrated may be combined to from the inventive concepts defined in the appended claims.

In accordance with the provisions of the patent statutes, the present invention has been described to represent what is considered to represent the preferred embodiments. However, it should be note that this invention can be practiced in other ways than those specifically illustrated and described without departing from the spirit or scope of this invention.

What is claimed is:

1. A method for determining an amount of metallic particles within a motor, comprising:
   providing an electrical circuit, wherein said electrical circuit comprises one or more electro-chemical cells, a motor, a motor output shaft resistor R1, a motor resistor R2, a motor housing resistor R3, a suspension resistor R4 in electrical communication with an iron line, a motor mount resistor R5 in electrical communication with an intermediate line and an iron wire resistor R6, wherein said intermediate line provides an electrical connection between a motor cover portion and a frame iron point of said electrical circuit;
   measuring resistance between said motor cover portion of said motor and said frame iron point of said electrical circuit;
   measuring voltage between said motor cover portion of said motor and said frame iron point of said electrical circuit; and
   calculating an iron line current $I_A$;
   calculating an assembly current $I_B$; and
   determining whether or not an amount of metallic particles within said motor has exceeded a pre-determined amount.

2. The method of claim 1, wherein said voltage between said motor cover portion of said motor and said frame iron point of said electrical circuit and/or said resistance between said motor cover portion of said motor and said frame iron point of said electrical circuit is determined using a voltmeter and/or a current caliper.

3. The method of claim 1, wherein said motor output shaft resistor R1, said motor housing resistor R3 and said suspension resistor R4 are wired in said electrical circuit in a series arrangement.

4. The method of claim 1, wherein said motor mount resistor R5 and said iron wire resistor R6 are wired in said electrical circuit in a parallel arrangement.

5. The method of claim 1, wherein the motor output shaft resistor R1, the motor housing resistor R3, and/or the suspension resistor R4 are wired in series with a parallel configuration of the motor mount resistor R5 and the iron wire resistor R6, thereby providing the electrical circuit with a series-parallel configuration.

6. The method of claim 1, wherein said one or more electro-chemical cells comprises one or more batteries, one or more rechargeable batteries, or one or more fuel cells.

7. The method of claim 1, wherein said motor is an electric motor.

8. The method of claim 1, wherein said frame iron point comprises a ground for said electrical circuit.

9. The method of claim 1, wherein said motor cover portion of said electrical circuit is in electrical communication with said electrical circuit at a location between said motor output shaft resistor R1 and said one or more electro-chemical cells in said electrical circuit.

10. The method of claim 1, wherein said iron line current $I_A$ and/or said assembly current $I_B$ is determined before and/or after connecting said iron line to said electrical circuit.

11. The method of claim 1, wherein said assembly current $I_B$ is determined based on said iron line current $I_A$ calculated within said electrical circuit.

12. The method of claim 1, wherein said determination of whether or not said amount of metallic particles within said motor has exceeded a pre-determined amount is based on whether or not said iron line current $I_A$ and/or said assembly current $I_B$ within said electrical circuit exceeds a pre-determined amount.

13. The method of claim 1, wherein said amount of metallic particles is an amount of iron particles within said motor.

14. The method of claim 1, wherein the motor output shaft resistor R1, the motor housing resistor R3, and/or the suspension resistor R4 are wired in series with a parallel configuration of the motor mount resistor R5 and the iron wire resistor R6, thereby providing the electrical circuit with a series-parallel configuration, wherein said one or more electro-chemical cells comprises one or more batteries, one or more rechargeable batteries, or one or more fuel cells, wherein said frame iron point comprises a ground for said electrical circuit, wherein said motor cover portion of said electrical circuit is in electrical communication with said electrical circuit at a location between said motor output shaft resistor R1 and said one or more electro-chemical cells in said electrical circuit, and wherein said determination of whether or not said amount of metallic particles within said motor has exceeded a pre-determined amount is based on whether or not said iron line current $I_A$ and/or said assembly current $I_B$ within said electrical circuit exceeds a pre-determined amount.

15. A method for determining an amount of metallic particles within a motor, comprising:
providing an electrical circuit, wherein said electrical circuit comprises one or more electro-chemical cells, a motor, a motor output shaft resistor R1, a motor resistor R2, a motor housing resistor R3, a suspension resistor R4 in electrical communication with an iron line, a motor mount resistor R5 in electrical communication with an intermediate line and an iron wire resistor R6, wherein said intermediate line provides an electrical connection between a motor cover portion and a frame iron point of said electrical circuit;
flowing an iron line current through said iron line for a predetermined iron line connection time;
disconnecting said iron line from said electrical circuit after said predetermined iron line connection time; and
determining the amount of metallic particles within said motor base on a voltage and/or a resistance between the motor cover portion of the motor and the frame iron point of said electrical circuit.

16. The method of claim 15, wherein the motor output shaft resistor R1, the motor housing resistor R3, and/or the suspension resistor R4 are wired in series with a parallel configuration of the motor mount resistor R5 and the iron wire resistor R6, thereby providing the electrical circuit with a series-parallel configuration.

17. The method of claim 16, wherein said one or more electro-chemical cells comprises one or more batteries, one or more rechargeable batteries, or one or more fuel cells, wherein said motor is an electric motor, wherein said frame iron point comprises a ground for said electrical circuit, and wherein said motor cover portion of said electrical circuit is in electrical communication with said electrical circuit at a location between said motor output shaft resistor R1 and said one or more electro-chemical cells in said electrical circuit.

18. A method of monitoring an amount of metallic particles within a motor, comprising:
providing an electrical circuit, wherein said electrical circuit comprises one or more electro-chemical cells, a motor, a motor output shaft resistor R1, a motor resistor R2, a motor housing resistor R3, a suspension resistor R4 in electrical communication with an iron line, a motor mount resistor R5 in electrical communication with an intermediate line and an iron wire resistor R6, wherein said intermediate line provides an electrical connection between a motor cover portion and a frame iron point of said electrical circuit;
flowing an iron line current through said iron line;
determining the amount of metallic particles within said motor base on a voltage and/or a resistance between the motor cover portion of the motor and the frame iron point of said electrical circuit; and
triggering a warning if the amount of metallic particles within said motor has exceeded a pre-determined amount.

19. The method of claim 18, wherein the motor output shaft resistor R1, the motor housing resistor R3, and/or the suspension resistor R4 are wired in series with a parallel configuration of the motor mount resistor R5 and the iron wire resistor R6, thereby providing the electrical circuit with a series-parallel configuration.

20. The method of claim 19, wherein said one or more electro-chemical cells comprises one or more batteries, one or more rechargeable batteries, or one or more fuel cells, wherein said motor is an electric motor, wherein said frame iron point comprises a ground for said electrical circuit, and wherein said motor cover portion of said electrical circuit is in electrical communication with said electrical circuit at a location between said motor output shaft resistor R1 and said one or more electro-chemical cells in said electrical circuit.

* * * * *